United States Patent
Rivero et al.

(10) Patent No.: US 10,049,982 B2
(45) Date of Patent: Aug. 14, 2018

(54) METHOD FOR FORMING AT LEAST ONE ELECTRICAL DISCONTINUITY IN AN INTERCONNECTION PART OF AN INTEGRATED CIRCUIT WITHOUT ADDITION OF ADDITIONAL MATERIAL, AND CORRESPONDING INTEGRATED CIRCUIT

(71) Applicant: STMicroelectronics (Rousset) SAS, Rousset (FR)

(72) Inventors: Christian Rivero, Rousset (FR); Pascal Fornara, Pourrieres (FR); Guilhem Bouton, Peynier (FR); Mathieu Lisart, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/596,877

(22) Filed: May 16, 2017

(65) Prior Publication Data

US 2018/0145027 A1    May 24, 2018

(30) Foreign Application Priority Data

Nov. 22, 2016    (FR) ...................................... 16 61346

(51) Int. Cl.
  *H01L 21/768* (2006.01)
  *H01L 23/522* (2006.01)
  *H01L 23/528* (2006.01)

(52) U.S. Cl.
  CPC ...... *H01L 23/5283* (2013.01); *H01L 21/7685* (2013.01); *H01L 21/76804* (2013.01);
  (Continued)

(58) Field of Classification Search
  CPC ........... H01L 23/5283; H01L 21/76892; H01L 21/76883; H01L 21/76843; H01L 21/7685;
  (Continued)

(56) References Cited

U.S. PATENT DOCUMENTS 6,791,191 B2    9/2004    Chow et al.
7,402,514 B2 *    7/2008    Tsu ................... H01L 21/76807
                                                        257/E21.579
(Continued)

FOREIGN PATENT DOCUMENTS

DE        69715472 T2    4/2003
DE    102013224060 A1    5/2015
(Continued)

OTHER PUBLICATIONS

INPI Search Report and Written Opinion for FR 1661346 dated Oct. 13, 2017 (7 pages).

*Primary Examiner* — Jasmine Clark
(74) *Attorney, Agent, or Firm* — Crowe & Dunlevy

(57) ABSTRACT

An integrated circuit includes an interconnection part with a via level situated between a lower metallization level and an upper metallization level. The lower metallization level is covered by an insulating encapsulation layer and an inter-metallization level insulating layer. An electrical discontinuity is provided between a via of the via level and a metal track of the lower metallization level. The electrical discontinuity is formed by an additional insulating layer having a material composition identical to that of the inter-metallization level insulating layer. The electrical discontinuity is situated between a bottom of the via and a top of the metal track, with the discontinuity being bordered by the insulating encapsulation layer.

11 Claims, 2 Drawing Sheets

(52) U.S. Cl.
CPC .. *H01L 21/76883* (2013.01); *H01L 21/76892* (2013.01); *H01L 23/5226* (2013.01)

(58) Field of Classification Search
CPC .......... H01L 23/5226; H01L 21/76813; H01L 21/02063; H01L 21/76877; H01L 23/528; H01L 21/76805; H01L 21/76802; H01L 21/76807
See application file for complete search history.

(56) References Cited

U.S. PATENT DOCUMENTS

| | | |
|---|---|---|
| 9,502,405 B1 | 11/2016 | Cao et al. |
| 2008/0174022 A1 | 7/2008 | Chen et al. |
| 2008/0293242 A1 | 11/2008 | Cooney, III et al. |
| 2009/0111257 A1 | 4/2009 | Hsu et al. |
| 2010/0155846 A1 | 6/2010 | Mukherjee et al. |
| 2016/0254227 A1 | 9/2016 | Leobandung |

FOREIGN PATENT DOCUMENTS

| | | |
|---|---|---|
| JP | S61147551 A | 7/1986 |
| JP | 2008205019 A | 9/2008 |
| WO | WO-9857373 A1 | 12/1998 |

\* cited by examiner

METHOD FOR FORMING AT LEAST ONE ELECTRICAL DISCONTINUITY IN AN INTERCONNECTION PART OF AN INTEGRATED CIRCUIT WITHOUT ADDITION OF ADDITIONAL MATERIAL, AND CORRESPONDING INTEGRATED CIRCUIT

PRIORITY CLAIM

This application claims the priority benefit of French Application for Patent No. 1661346, filed on Nov. 22, 2016, the disclosure of which is hereby incorporated by reference in its entirety.

TECHNICAL FIELD

Embodiments and their implementations relate to integrated circuits and, more particularly, to their protection against "reverse engineering" carried out based on photographic top views of various layers of the integrated circuit.

BACKGROUND

There is a need in the art for an integrated circuit whose structure and method of fabrication render an automatic pattern recognition used during reverse engineering complicated, or even virtually impossible, notably by increasing the rate of extraction errors so as to render virtually impossible the extraction of the description (or "netlist") of the integrated circuit based on a photographic (for example, bottom) view of the layout.

SUMMARY

In an embodiment, the formation of at least one electrical discontinuity is in particular provided in the interconnection part (commonly denoted by those skilled in the art using the acronym BEOL: "Back End Of Line") of the integrated circuit and, more particularly, between at least one via of a via level, separating a lower metallization level from an upper metallization level, and at least one metal track from said lower metallization level.

The interconnection part (BEOL) is situated on top of a substrate of the integrated circuit. Consequently, lower metallization level is understood to mean a metallization level which is situated closer to the substrate than an upper metallization level.

Thus, according to one aspect, a method is provided for forming at least one electrical discontinuity in at least one via level situated between a lower metallization level and an upper metallization level of an interconnection part of an integrated circuit, comprising: the formation of the lower metallization level covered by an insulating encapsulation layer; the formation, on top of the encapsulation layer, of an inter-metallization level insulating layer (generally known by those skilled in the art under the acronym IMD: "Inter-Metal Dielectric"); the formation, within said inter-metallization level insulating layer, of at least a first metal track situated at the upper metallization level and of at least a first via in electrical contact with said at least a first track and with at least a second metal track of the lower metallization level, through said encapsulation layer; and the formation, at the level of said encapsulation layer, of said at least one electrical discontinuity between at least a second via of said via level and at least a third track of said lower metallization level, after the formation of each first via and of each first metal track of the upper metallization level.

This third track of the lower metallization level may be distinct from the second track or else form with the latter one and the same track.

Thus, such an electrical discontinuity, formed at the level of the encapsulation layer, of the lower metallization level under a via is virtually, or even totally, non-detectable by a photographic view and allows, for example, the pretense, when the metal track situated opposite the via having this electrical discontinuity is, for example, connected to an electric circuit, of the electric circuit being operational (for example, with connection to a drain region of a transistor, the pretense that this transistor is electrically functional whereas it is permanently OFF, in other words functionally inactive, owing to the presence of this discontinuity).

According to one embodiment, the formation of each electrical discontinuity comprises: a localized etching of said inter-metallization level insulating layer and of the encapsulation layer at each location of a second via in such a manner as to form an orifice opening out onto a part of the corresponding third track; a coating of the internal wall of each orifice and of said part of the third track by an additional insulating layer of identical composition to that of the inter-metallization level insulating layer; and a filling of each coated orifice with a filler material of composition identical to that of each first via and of each first track, in such a manner as to form the corresponding second via and a fourth track situated at the upper metallization level and in contact with this second via.

The fact that the additional insulating layer which coats the orifice and a part of the corresponding third track has a composition identical to that of the inter-metallization level insulating layer ("IMD" layer) will contribute to rendering the discrimination of a second via with respect to a first via particularly difficult and rendering a reverse engineering operation even more complicated.

Furthermore, no additional material is used here to form this electrical discontinuity.

Thus, by way of example, the inter-metallization level insulating layer ("IMD" layer) and the additional insulating layer may comprise, for example, tetra-orthosilicate of silicon (TEOS) or else a material with low dielectric constant such as a material of the SiOC type.

According to one embodiment and in such a manner as to render this discrimination even more difficult, said localized etching and said coating are configured so as to obtain, for each coated orifice, a lower part the size of whose opening leads, after its filling, to the corresponding second via having a transverse cross-section of size analogous to that of the transverse cross-section of each first via.

In other words, prior to being coated, the orifice is slightly larger than the orifices used to form the first vias and the first tracks and this size and the thickness of the coating layer are chosen so as to finally obtain a size of via that is analogous for all the vias, whether this be first vias or second vias.

The term "analogous" here is understood to mean identical or substantially identical, to within the fabrication tolerances.

According to another aspect, an integrated circuit is provided, comprising an interconnection part comprising a via level situated between a lower metallization level, covered by an insulating encapsulation layer and by an inter-metallization level insulating layer, and an upper metallization level, and at least one electrical discontinuity between at least one via of said via level and at least one track of said lower metallization level, said at least one electrical discontinuity comprising an additional insulating layer, of composition identical to that of the inter-metallization level insulating layer, situated between said at least one via and said at least one track and bordered by said encapsulation layer.

According to one embodiment, each via has a transverse cross-section of size analogous to that of the transverse cross-section of each other via not associated with an electrical discontinuity.

According to another aspect, an object is provided, for example a smartcard or an electronic device, such as for example a cellular mobile telephone or a tablet, comprising an integrated circuit such as defined hereinbefore.

BRIEF DESCRIPTION OF THE DRAWINGS

Other advantages and features of the invention will become apparent upon examining the detailed description of embodiments and their implementations, which are in no way limiting, and from the appended drawings, in which.

DETAILED DESCRIPTION

Figure 1:
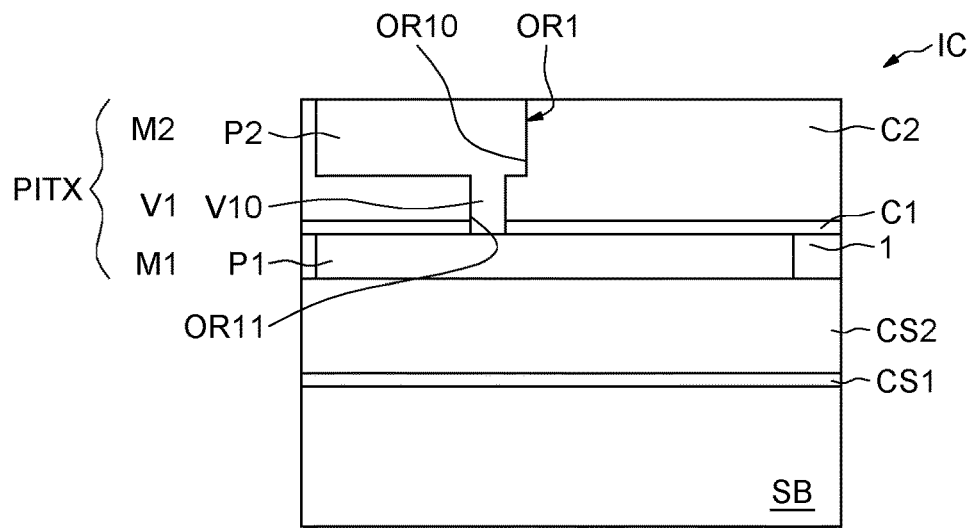
FIGS. 1 to 4 illustrate schematically an embodiment and implementation.

In FIG. 1, the reference IC denotes an integrated circuit whose semiconductor substrate SB is shown here schematically, in and on which components are fabricated (not shown here for the sake of simplicity) comprising, for example, transistors with source and drain regions.

The integrated circuit IC comprises, on top of the substrate, an interconnection part PITX (BEOL) generally comprising several metallization levels, together with several via levels between these metallization levels.

In FIG. 1, for the sake of simplicity, the first metallization level M1 has been shown which, in the following will be denoted as a "lower metallization level" and the second metallization level M2 which will be denoted in the following as an "upper metallization level", these two levels are separated by the first via level V1.

However, the embodiments herein are applicable to any lower metallization level Mn and to any upper metallization level Mn+1 of the interconnection part PITX, separated by the via level Vn.

The lower metallization level M1 has been formed in a conventional manner and comprises metal tracks, only one of which is shown and referenced P1, encapsulated in an inter-track dielectric material 1.

The metallization level M1 is covered by an insulating encapsulation layer C1, for example of silicon carbonitride (SiCN).

The substrate SB and the components of the integrated circuit are separated from the first metallization level M1 by an insulating region here comprising a first insulating layer CS1, for example of SiCN on top of which there is a second insulating layer CS2 for example of a material of the $SiO_2$ type. This second insulating layer CS2 is, for example, better known by those skilled in the art under the acronym PMD ("Pre-Metal Dielectric") layer.

The components of the integrated circuit supported by the substrate SB are connected to the metal tracks of the first metallization level M1 by electrically-conducting contacts, for example made of tungsten, and are encased in the insulating region CS1, CS2. For simplicity, such contacts are not shown in FIG. 1.

As illustrated in FIG. 1, an insulating inter-level metallization layer C2 (for example, better known by those skilled in the art under the acronym IMD ("Inter-Metal Dielectric") layer) is formed on the encapsulation layer C1.

This layer IMD C2 may be of tetra-orthosilicate of silicon (TEOS) or else may comprise a material with low dielectric constant for example of the $SiO_2$ type or else of the SiOC type.

First vias of the via level V1 are subsequently formed in the inter-level insulating layer C2, and first tracks are also formed, in a conventional manner.

FIG. 1 shows a first track P2 and a first via V10.

More precisely, for the formation of this first track P2 and of this first via V10, an orifice OR1 is formed by etching comprising an upper part OR10 designed to receive the first track P2 of the upper metallization level M2 and a lower part OR11 designed to receive the via V10 of the via level V1.

Each orifice OR1 opens out onto and extends through the encapsulation layer C1 to reach the track P1.

Then, the filling of the orifice OR1 is carried out with at least one filler material, for example copper, in order to form the track P2 and the via V10.

The via V10 is in electrical contact with the track P1, and thus forms a "second track".

Figure 2:
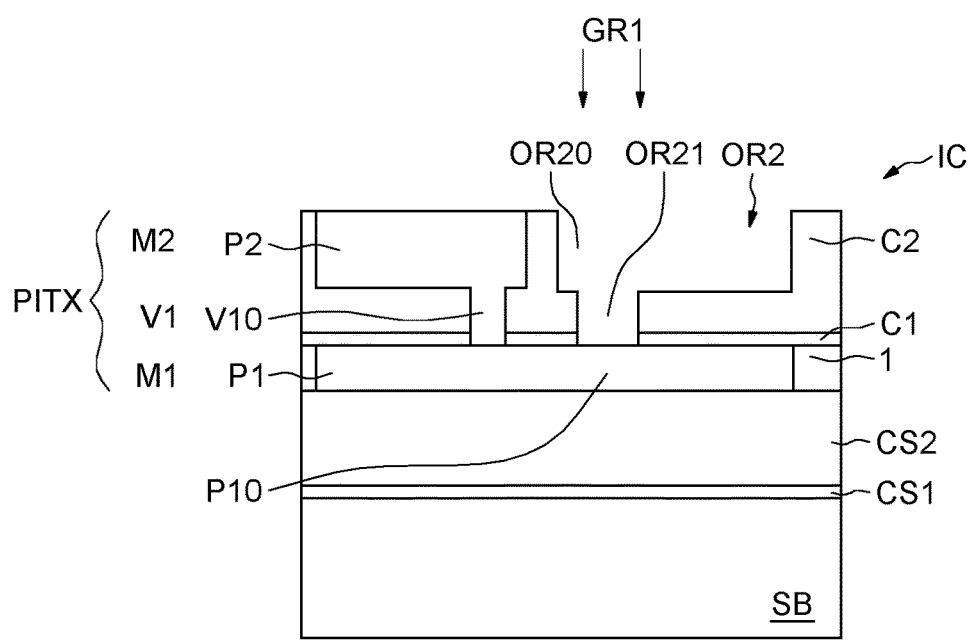

Then, as illustrated in FIG. 2, a localized etching GR1 of said inter-metallization level insulating layer C2 and of the encapsulation layer C1 is carried out at each location of a future second via in such a manner as to form an orifice OR2 having an upper part OR20 and a lower part OR21 opening out onto a part P10 of a corresponding third track, which in this example is a part P10 of the second track P1.

As can be seen in FIG. 2, the size of a transverse cross-section of the lower part OR21 of the orifice OR2 is greater than the size of a transverse cross-section of a first via V10 (and the corresponding orifice OR11).

Indeed, although not indispensable, but even more efficient from a reverse engineering point of view (in other words rendering it even more complicated), it is preferable to increase the cross section size of this orifice OR2 in such a manner as to finally obtain, as will be seen in more detail hereinafter, a second via on top of the part of track P10, whose size of the transverse cross-section is analogous, in other words identical or substantially identical to within a fabrication tolerance, to the size of a transverse cross-section of a first via V10.

Figure 3:
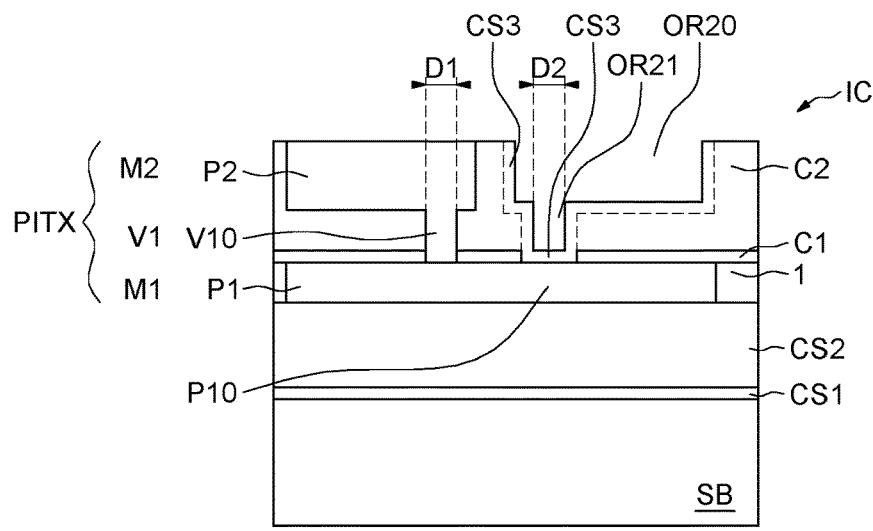

For this purpose, as illustrated in FIG. 3, the internal wall of the orifice OR2 and also the part of track P10 is coated with an insulating layer CS3 advantageously having a material composition identical to that of the insulating layer C2. Thus, for example, the insulating layer CS3 may be a deposited TEOS layer to match the material used for the insulating layer C2. Any suitable process for a conformal layer or lining deposit of insulating material may be used.

Furthermore, the size of the orifice OR2, together with the thickness of the insulating layer CS3, are chosen in such a manner that the size D2 of a transverse cross-section of the lower part of the orifice thus coated OR2 is analogous to the size D1 of a transverse cross-section of a first via V10.

Figure 4:
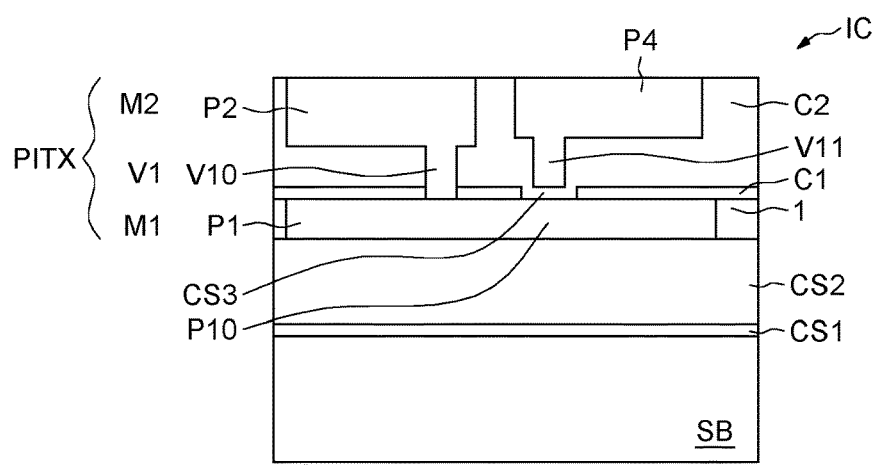

Then, as illustrated in FIG. 4, in a conventional manner known per se, the filling of the coated orifice OR2 is carried out with at least one filler material of composition identical to that of each first via V10 and of each first track P1 in such a manner as to form the corresponding second via V11 and a fourth track P4 situated at the upper metallization level and in contact with this second via V11.

However, the lower end of the second via V11 is located at a distance from the part of track P10 and is separated from the latter by the insulating layer CS3. Consequently, the second via V11 is not in electrical contact with the part of track P10, thus creating an electrical discontinuity within the integrated circuit.

A chemical-mechanical polishing is subsequently carried out so as to obtain the structure illustrated in FIG. 4.

The fabrication of the integrated circuit is subsequently continued in a conventional manner.

An integrated circuit, comprising an interconnection part PITX comprising a via level V1 situated between a lower metallization level M1, covered by an insulating encapsulation layer C1 and by an inter-metallization level insulating layer C2, and an upper metallization level M2, and at least one electrical discontinuity CS3 between at least one via V1 of said via level and at least one track P1 of said lower metallization level, said at least one electrical discontinuity comprising an additional insulating layer CS3, of composition identical to that of the inter-metallization level insulating layer C2, situated between said at least one via V11 and said at least one track P1 and bordered by said encapsulation layer C1.

Furthermore, each via V11 has a transverse cross-section of size analogous to that of the transverse cross-section of each other via V10 not associated with an electrical discontinuity.

Figure 5:
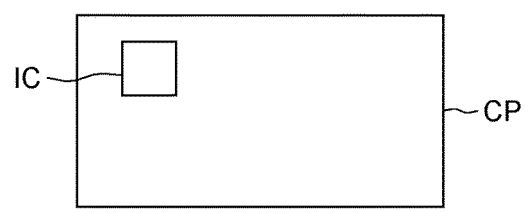
FIG. 5 illustrates schematically a smartcard.

Such an integrated circuit IC may be incorporated into any object, notably a smartcard CP such as illustrated very schematically in FIG. 5.

The invention claimed is:

1. A method, comprising:
   forming a lower metallization level of an interconnection part of an integrated circuit;
   covering the lower metallization level with an insulating encapsulation layer;
   forming an inter-metallization level insulating layer on top of the insulating encapsulation layer;
   forming within said inter-metallization level insulating layer a first metal track situated at an upper metallization level of the interconnection part of the integrated circuit and including at least a first via extending through said insulating encapsulation layer, said first via in electrical contact with both the first metal track and a second metal track of the lower metallization level; and
   forming at a level of said insulating encapsulation layer an electrical discontinuity between a second via within the inter-metallization level insulating layer and a third metal track of said lower metallization level, after forming the first via and the first metal track of the upper metallization level.

2. The method according to claim 1, wherein forming the electrical discontinuity comprises:
   locally etching said inter-metallization level insulating layer and the insulating encapsulation layer at a location of the second via to form an orifice opening onto a part of the third metal track;
   coating an internal wall of the orifice and said part of the third metal track with an additional insulating layer having a material composition identical to a material composition of the inter-metallization level insulating layer; and
   filling the coated orifice with a filler material of a material composition identical to a material composition of the first via and the first track so as to form the second via and a fourth metal track situated at the upper metallization level and in contact with the second via.

3. The method according to claim 2, wherein locally etching and coating are configured so as to obtain, for the coated orifice, a lower part having a cross-sectional size such that said second via has a transverse cross-section of size analogous to a transverse cross-section of size of the first via.

4. An integrated circuit, comprising:
   an interconnection part including a via level situated between a lower metallization level and an upper metallization level, said lower metallization level covered by an insulating encapsulation layer and an inter-metallization level insulating layer;
   an electrical discontinuity between a via of said via level and a metal track of said lower metallization level, said electrical discontinuity comprising an additional insulating layer having a material composition identical to a material composition of the inter-metallization level insulating layer;
   wherein said additional insulating layer is situated between said via and said metal track and bordered by said insulating encapsulation layer.

5. The integrated circuit according to claim 4, wherein the via has a transverse cross-sectional size analogous to a transverse cross-section size of other vias in the via level which are electrically connected to metal tracks within the lower metallization level.

6. The integrated circuit according to claim 4, wherein integrated circuit is included within an object.

7. The integrated circuit according to claim 6, wherein the object is a smartcard.

8. A method, comprising:
   forming a lower metallization level of an integrated circuit to include a first metal track and a second metal track;
   covering the lower metallization level with an insulating encapsulation layer;
   covering of the insulating encapsulation layer with an inter-metallization level insulating layer;
   forming a first opening extending through the inter-metallization level insulating layer and the insulating encapsulation layer to expose a top of the first metal track;
   depositing metal material in the first opening to form a third metal track of an upper metallization level and a first via electrically connecting the third metal track to the first metal track;
   forming a second opening extending through the inter-metallization level insulating layer and the insulating encapsulation layer to expose a top of the second metal track;
   lining the second opening with an insulating layer made of a same material as the inter-metallization level insulating layer, said insulating layer covering the top of the second metal track; and
   depositing metal material in the second opening to form a fourth metal track of the upper metallization level and a second via, said insulating layer electrically insulating a bottom of the second via from said second metal track.

9. The method of claim 8, wherein forming the first opening comprises forming a first via opening having a first cross-sectional size; and wherein forming the second opening comprises forming a second via having a second cross-sectional size that is larger than the first cross-sectional by an amount which corresponds to a thickness of the insulating layer.

10. An integrated circuit, comprising:
    a lower metallization level of an integrated circuit including a first metal track and a second metal track;

an insulating encapsulation layer covering the lower metallization level;
an inter-metallization level insulating layer covering of the insulating encapsulation layer;
an upper metallization level in the inter-metallization level insulating layer including a third metal track and a fourth metal track;
a first via electrically connecting the third metal track to the first metal track, said first via passing through a first opening in the insulating encapsulation layer;
a second via electrically connected to the fourth metal track and insulated from the first metal track by an insulating layer within a second opening in the insulating encapsulation layer, said second opening aligned with a location of the second via.

11. The integrated circuit of claim 10, wherein a material of the insulating layer is a same material as a material of the inter-metallization level insulating layer.

\* \* \* \* \*